United States Patent
Jeong et al.

(10) Patent No.: US 7,212,428 B2
(45) Date of Patent: May 1, 2007

(54) FERAM HAVING DIFFERENTIAL DATA

(75) Inventors: Dong Yun Jeong, Chungcheongbuk-do (KR); Jae Hyoung Lim, Seoul (KR); Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 44 days.

(21) Appl. No.: 10/876,485

(22) Filed: Jun. 28, 2004

(65) Prior Publication Data

US 2005/0152172 A1    Jul. 14, 2005

(30) Foreign Application Priority Data

Jan. 12, 2004    (KR) ............... 10-2004-0001949

(51) Int. Cl.
*G11C 11/22* (2006.01)
(52) U.S. Cl. .................. 365/145; 365/230.03
(58) Field of Classification Search ........... 365/145, 365/230.03
See application file for complete search history.

(56) References Cited

U.S. PATENT DOCUMENTS 6,542,424 B2 * 4/2003 Endo et al. ............ 365/205
2003/0086312 A1  5/2003 Kang

FOREIGN PATENT DOCUMENTS

KR    1020030037789 A    5/2003

* cited by examiner

*Primary Examiner*—Michael Tran
(74) *Attorney, Agent, or Firm*—Heller Ehrman LLP

(57) ABSTRACT

A non-volatile ferroelectric memory device having differential datacomprises a plurality of cell array blocks and a data buffer unit. Each of the plurality of cell array blocks includes cell arrays and sense amplifiers. The cell array has a hierarchical bit line architecture and are divided into top and bottom groups where differential data are stored in a plurality of unit cells corresponding to differential main bit lines of the divided cell arrays. The sense amplifiers are positioned between the divided cell array groups for sensing the differential data. The data buffer unit temporarily stores a read data sensed by the sense amplifier and a write data received through a data I/O port.

6 Claims, 17 Drawing Sheets

FERAM HAVING DIFFERENTIAL DATA

BACKGROUND OF THE INVENTION

1. Field of the Invention

The present invention relates to a non-volatile ferroelectric memory device having differential data, and more specifically, to a non-volatile ferroelectric memory device, in which cell arrays sharing a main bit line are divided into two groups by a sense amplifier located at the center therebetween, and differential data are stored in cells corresponding to at least two main bit lines (main bit line group) of the divided cell array groups.

2. Description of the Related Art

Generally, a ferroelectric random access memory (hereinafter, referred to as 'FeRAM') has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

FIG. 1 is a schematic diagram of a unit memory cell of a related art 1T1C embedded non-volatile ferroelectric memory device.

In the unit memory cell shown in FIG. 1, a bit line BL is formed in one direction and a word line WL is formed in a transverse direction with respect to the bit line BL. A plate line PL is formed in the same direction as the word line WL, being at a predetermined distance therefrom. An NMOS transistor TR has a gate connected to the word line WL and a source connected to the bit line BL. A ferroelectric capacitor FC has a first electrode connected to a drain of the NMOS transistor and a second electrode is connected to the plate line PL.

FIG. 2 is a timing diagram illustrating an operation of the memory cell in FIG. 1.

When a word line WL and a plate line PL in a selected cell are activated, a charge corresponding to a data "1" or "0" stored in the ferroelectric capacitor FC is applied to the bit line BL. In other words, voltages having different levels are generated in the bit line BL depending on the cell data.

FIG. 3 is a schematic diagram of a cell array block and a sensing amplifier in a related art non-volatile ferroelectric memory device having a hierarchical bit line architecture.

The cell array blocks BLK0–BLKn are vertically positioned symmetrical with respect to common data buses BUS(0)–BUS(n). Each main bit line MBL of the cell array block BLK 0–BLK n is selectively coupled to data bus BUS(0)–BUS(n) by a column selection unit C/S. Each cell array block BLK0–BLKn has a hierarchical bit line architecture including a plurality of sub bit lines (not shown) selectively coupled to one of the main bit lines MBL. In the hierarchical structure, a voltage applied to the sub bit line (not shown) is converted into current for inducing voltage change in the main bit line MBL. A sensing voltage induced on the main bit line is transferred to a sense amplifier S/A through the data buses BUS(0)–BUS(n). The sense amplifier S/A compares the sensing voltage transferred through the data buses BUS(0)–BUS(n) with a pre-determined reference voltage V_REF, and senses a cell data. Here, the common data buses BUS(0)–BUS(n) are shared by the cell array blocks BLK 0–BLK n, and each bus line of the data buses BUS(0)–BUS(n) is coupled to a main bit line MBL in each cell array block BLK 0–BLK n.

FIG. 4 is a circuit diagram illustrating in detail the cell array having a hierarchical bit line architecture and the column selection unit C/S shown in FIG. 3.

The sub bit lines SBL is connected a plurality of memory cells having a 1T1C (1 Transistor 1 Capacitor) structure which are connected between word lines WL(0)–WL(m−1) and plate lines PL(0)–PL(m−1). When an NMOS transistor T3 is turned on after a sub bit line selection signal SBSW1 is activated, a load on the main bit line MBL is reduced to one sub bit line SBL level. In addition, when an NMOS transistor T4 is turned on after a sub bit line pull-down signal SBPD is activated, the sub bit line SBL is adjusted to the ground voltage level.

A sub bit line pull-up signal SBPU is a signal for adjusting power supply to the sub bit line SBL, and a sub bit line selection signal SBSW2 adjusts a signal for applying the sub bit line pull-up signal SBPU to the sub bit line SBL.

The main bit line MBL is selectively coupled to the common data bus BUS(0) by a column selection unit C/S that turns on/off in response to a column selection signal CS0.

The sense amplifier S/A compares the sensing voltage transferred through the data buses BUS(0)–BUS(n) with the pre-determined reference voltage V_REF, and senses a cell data. Then the sense amplifier S/A outputs SA_OUT to a data buffer (not shown).

FIG. 5 is a timing diagram for explaining the operation of the circuit illustrated in FIG. 4.

When a word line WL and a plate line PL are activated to a high level, the voltage levels on the sub bit line SBL and the main bit line MBL are determined depending on a data value of a corresponding memory cell. For example, if the data value in a cell is high, the voltage level on the sub bit line SBL is increased and thus, the amount of current flowing through the NMOS transistor T6 becomes larger. As a result, the voltage level of the main bit line MBL is reduced to a great degree. On the contrary, if the data value in the cell is low, the voltage on the sub bit line SBL is lowered and thus, the amount of current flowing through the NMOS transistor T6 becomes smaller. In this case, however, the voltage level of the main bit line MBL is reduced only slightly.

As described above, the level of a sensing voltage induced on the main bit line MBL is changed depending on the cell data (i.e. the data value), and when the column selection signal CS0 is activated, the sensing voltage is transferred to the sense amplifier S/A through a common data bus. The sense amplifier S/A compares the sensing voltage on the main bit line MBL with the reference voltage V_REF, and senses a cell data.

However, in the above-described system where the reference voltage is compared with the sensing voltage induced by a unit cell in order to sense a data in the corresponding cell, noise caused by an external impact is often generated in the reference voltage and as a result of this, a precise data sensing is not obtained. In addition, in the case of the related art 1T1C embedded memory cell where a 1-bit data is stored in one single unit cell and is sensed, if the ferroelectric capacitor of a selected cell is in abnormal state (WEAK), the sensing voltage is reduced and thus, sensing a data in a corresponding cell cannot be done as accurately as possible. Unfortunately this problem gets worse when the driving voltage of a chip becomes lower.

Moreover, because the sensing voltage induced on the main bit line is transferred to a sense amplifier through a common data bus, the common data bus acts as another factor of data sensing delay.

SUMMARY OF THE INVENTION

It is, therefore, an object of the present invention to provide an FeRAM having differential data for performing a stable cell data sensing operation insensitive to external factors, thereby improving the structure of a memory device with a hierarchical bit line architecture.

In an embodiment, a non-volatile ferroelectric memory device having differential data comprises a plurality of cell array blocks and a data buffer unit. Each of the plurality of cell array blocks includes cell arrays and sense amplifiers. The cell array has a hierarchical bit line architecture including a plurality of sub bit lines selectively coupled to one of a plurality of main bit lines. Here, the cell arrays are divided into top and bottom groups where differential data are stored in a plurality of unit cells corresponding to differential main bit lines of the divided cell arrays. Each of the cell array blocks also comprises sense amplifiers, positioned between the divided cell array groups, for receiving voltages induced on the differential main bit lines to sense a cell data. The data buffer unit temporarily stores a read data sensed by the sense amplifier and a write data received through a data I/O port.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENT

The present invention will be described in detail with reference to the accompanying drawings.

Figure 6:
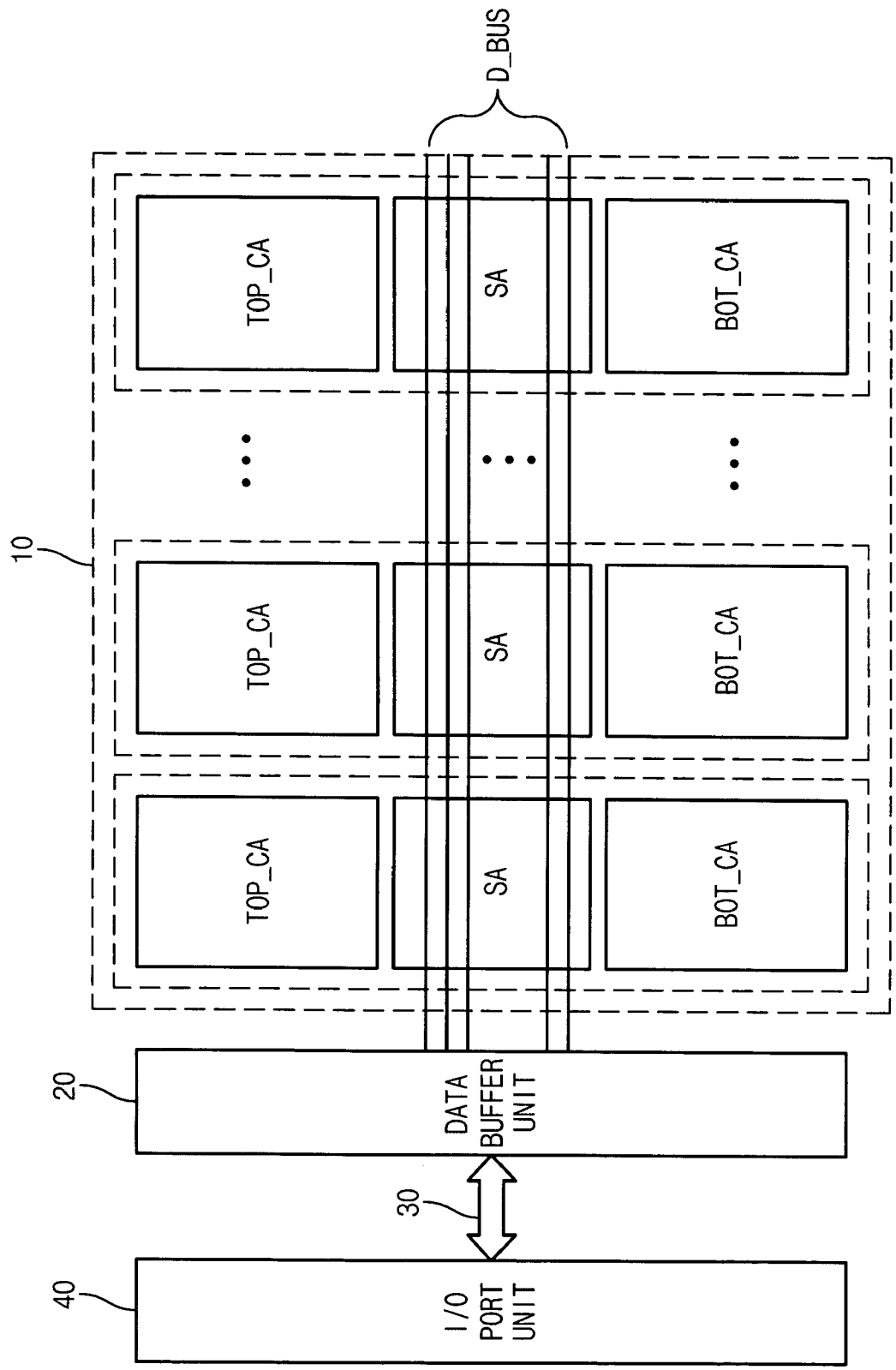
FIG. 6 is a schematic diagram of a non-volatile ferroelectric memory device according to the present invention.

FIG. 6 is a schematic diagram of a non-volatile ferroelectric memory device according to the present invention.

Referring to FIG. 6, the non-volatile ferroelectric memory device includes a plurality of cell array blocks 10, a data buffer unit 20, a data buffer bus 30, and an I/O port unit 40.

Figure 1:
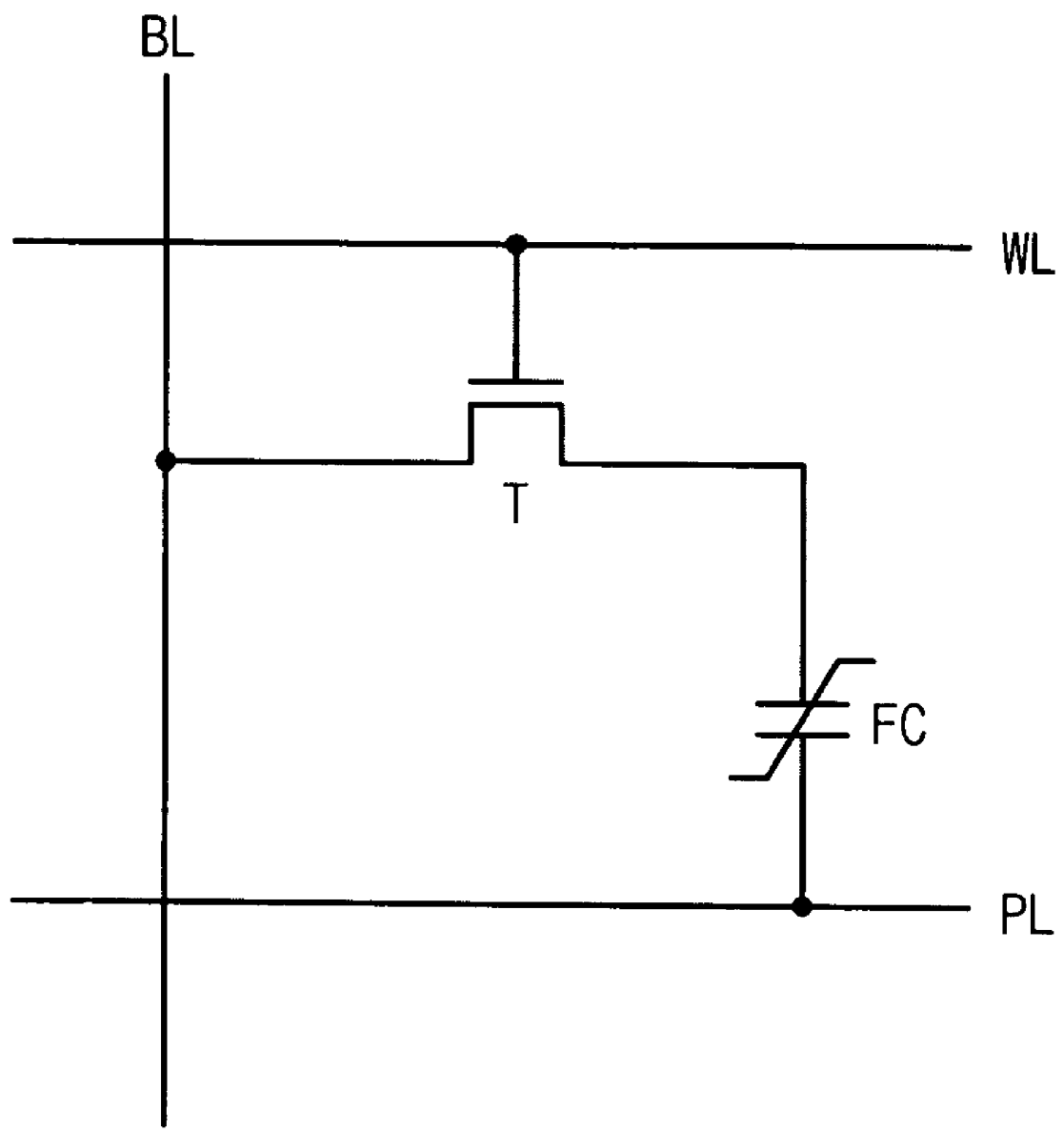
FIG. 1 is a schematic diagram of a unit memory cell of a related art 1T1C embedded non-volatile ferroelectric memory device.
Figure 2:
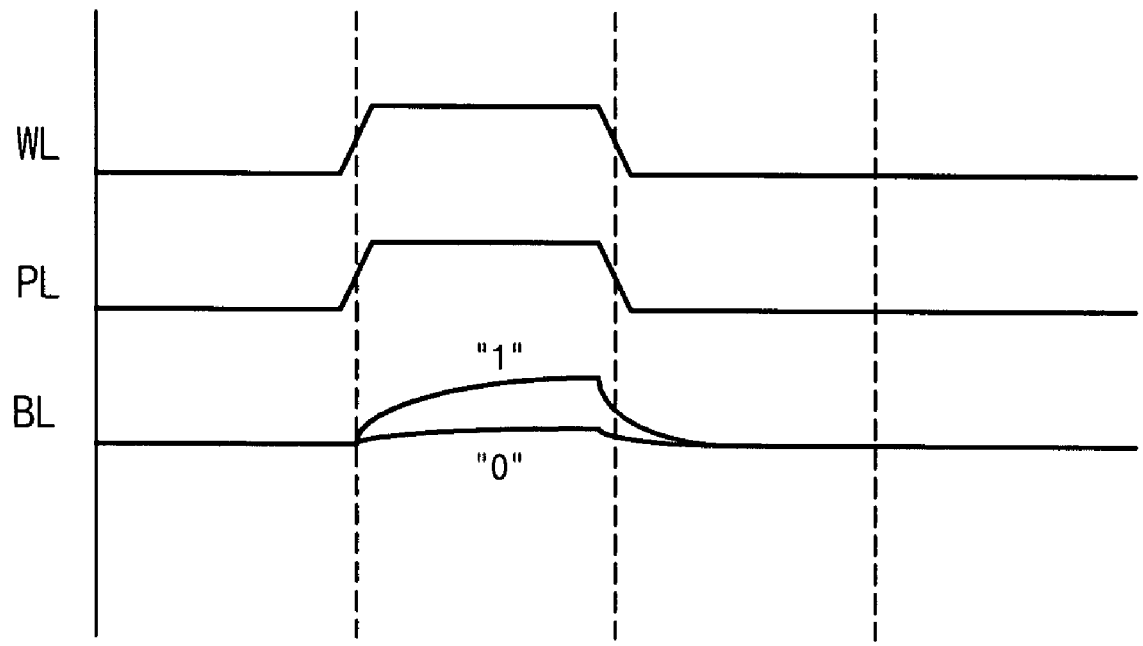
FIG. 2 is a timing diagram illustrating an operation of a unit cell in FIG. 1.
Figure 3:
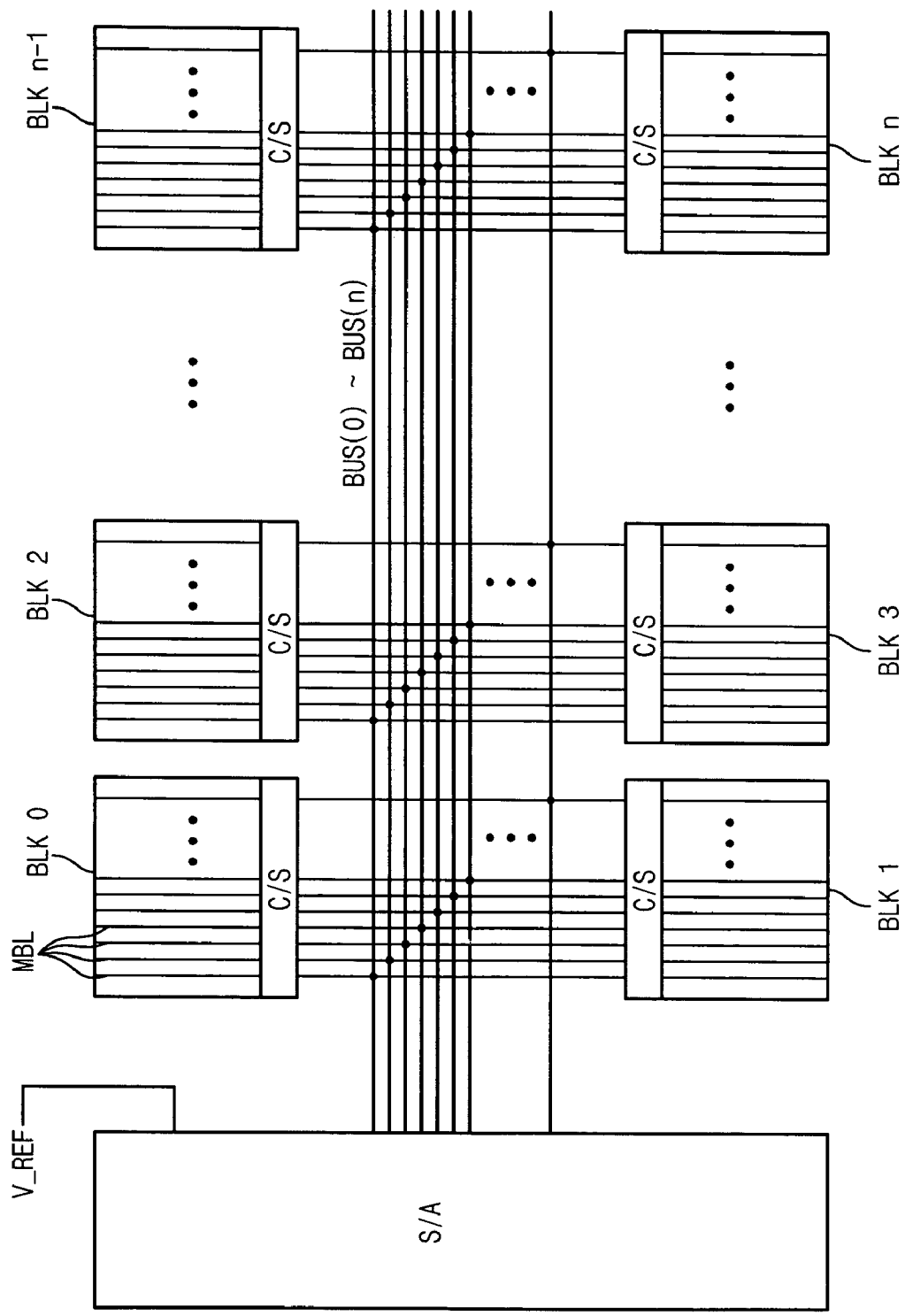
FIG. 3 is a schematic diagram of a cell array block and a sensing amplifier in a related art non-volatile ferroelectric memory device having a multi-bit line architecture.
Figure 4:
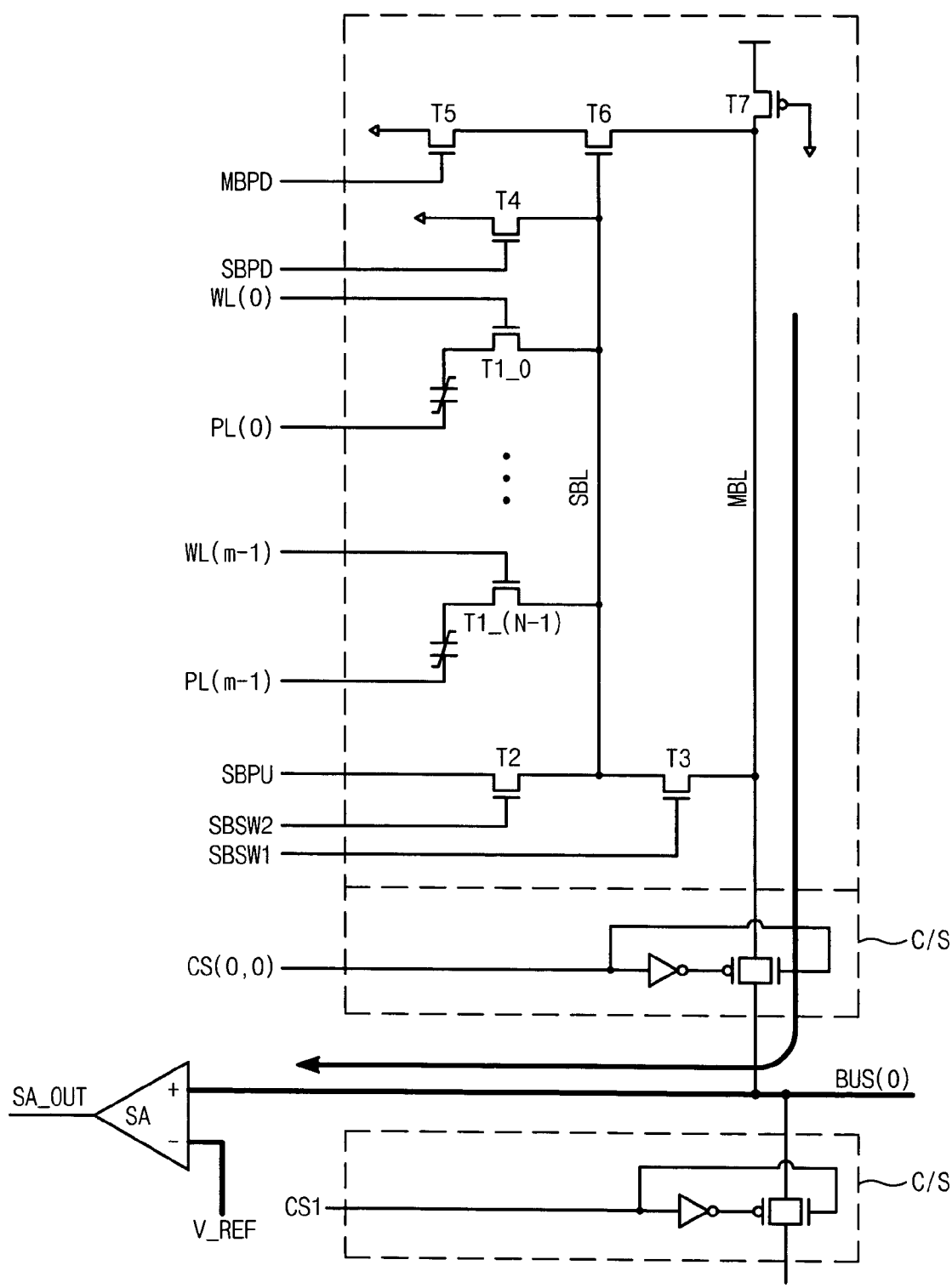
FIG. 4 is a circuit diagram illustrating in detail a cell array having a multi-bit line architecture and a column selection unit shown in FIG. 2.
Figure 5:
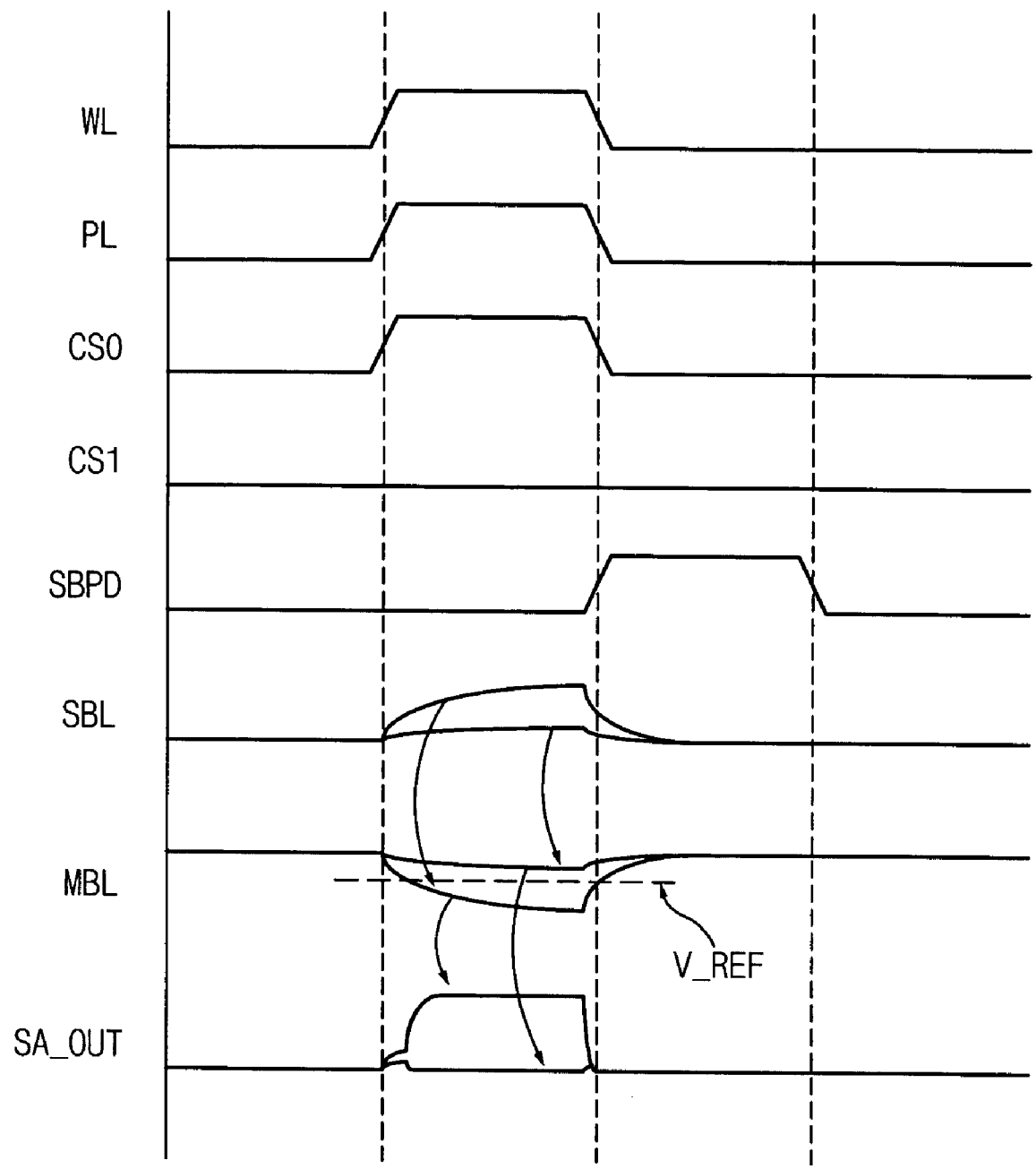
FIG. 5 is a timing diagram for explaining an operation of a circuit illustrated in FIG. 4.

The cell array block 10 consists of a cell array having a hierarchical bit line architecture for storing data as shown in FIG. 4. Unlike in the related art cell array block of FIG. 4, however, cell arrays in the cell array block 10 of FIG. 6 are divided into two groups a top cell array group TOP_CA and a bottom cell array group BOT_CA with respect to sense amplifiers SA at the center. The sense amplifiers SA, which are directly connected to main bit lines in those two cell array groups TOP_CA, BOT_CA, receive induced voltages on the main bit lines, thereby sensing a cell data and transferring a sensed read data to the data buffer unit 20. And, the sense amplifiers SA transfer write data applied from the data buffer unit 20 to the main bit lines of the cell array groups TOP_CA, BOT_CA.

Here, the cell array block 10 stores differential data in the cell arrays with a plurality of adjacent main bit lines MBL, /MBL in each cell array group TOP_CA, BOT_CA, or in the cell arrays with a plurality of main bit lines MBL, /MBL that are symmetric in those two cell array groups TOP_CA, BOT_CA. Hereinafter, a plurality of (e.g., two in the present invention) the main bit lines MBL, /MBL where the differential data are induced will be called 'differential main bit lines'.

The sense amplifiers SA, which are directly connected to at least one of the differential main bit lines MBL and /MBL, receive the two sensing voltages induced on the differential main bit lines MBL, /MBL and sense the differential data. Therefore, each sense amplifier SA does not require a separate reference voltage V_REF as in FIG. 4.

The data buffer unit 20, which is connected to the sense amplifiers SA through a data bus D_BUS, temporarily stores read data sensed in the sense amplifier SAs. And, the data buffer unit 20, which is also connected to the I/O port unit 40 through the data buffer bus 30, temporarily stores write data applied from the I/O port unit 40.

The I/O port unit 40 outputs read data applied through the data buffer bus 30, and transfers write data applied from outside to the data buffer unit 20 through the data buffer bus 30.

Figure 7:
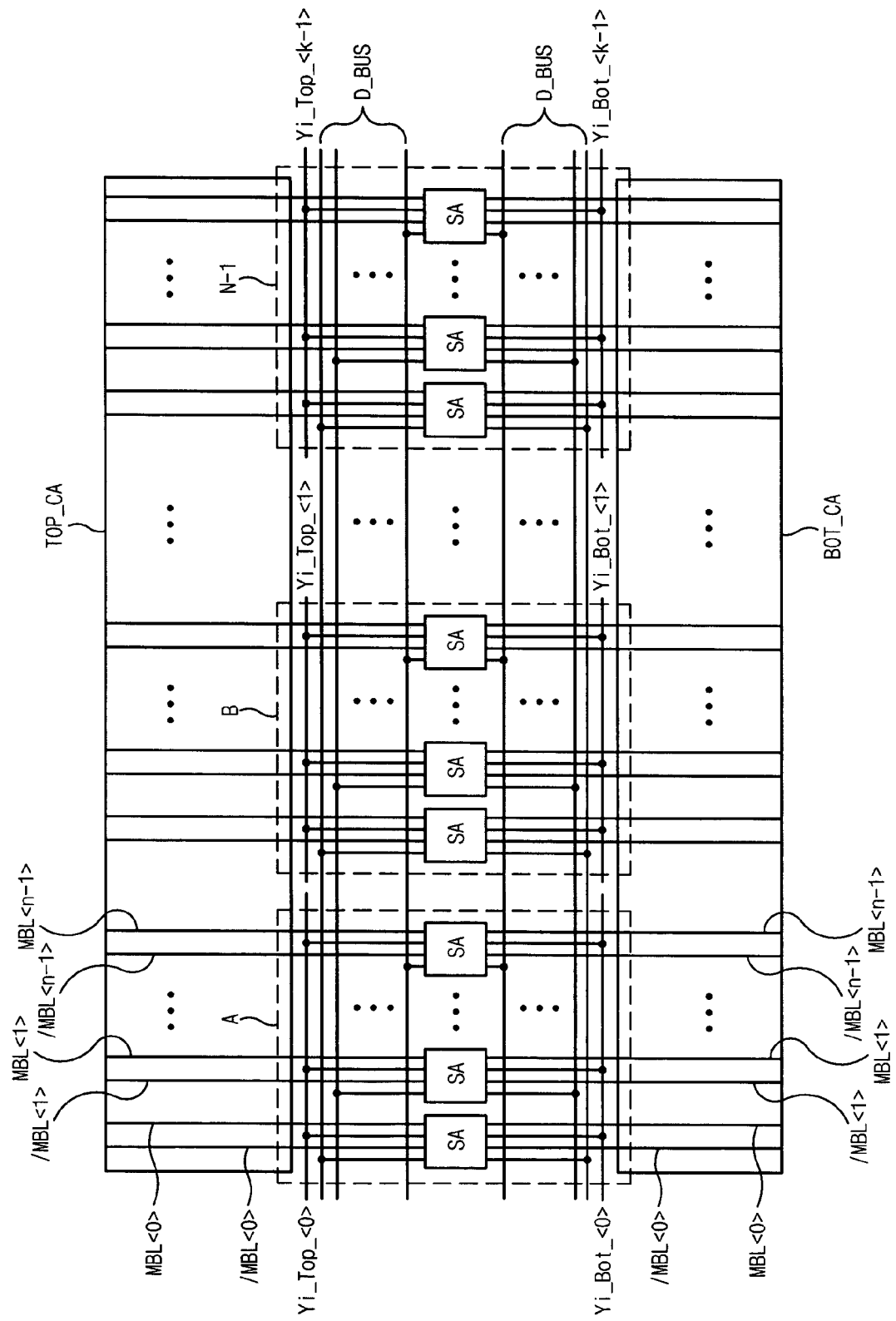
FIG. 7 is a schematic diagram of a cell array block of FIG. 6, illustrating a connection relation between a main amplifier line and a sense amplifier according to a first embodiment of the present invention.

FIG. 7 is a schematic diagram of the cell array block 10 of FIG. 6, illustrating a connection relation between the main amplifier lines MBL, /MBL and the sense amplifier SA according to a first embodiment of the present invention.

In this embodiment, differential data are respectively stored in the top cell array group TOP_CA and the bottom cell array group BOT_CA.

Accordingly, two adjacent main bit lines in the top cell array group TOP_CA or the bottom cell array group BOT_CA, respectively, are differential main bit lines MBL, /MBL, and differential data are stored in a cell array corresponding to the differential main bit lines MBL, /MBL.

The sense amplifiers SAs are selectively connected to two differential main bit lines, i.e. one differential main bit line in the top cell array group TOP_CA or one differential main bit line in the bottom cell array group BOT_CA, and sense differential data.

Also, the sense amplifiers SAs divided into data bit units A, B, . . . , N-1 (hereinafter, they are called as 'sense amplifier groups') where data are inputted/outputted at the same time with a one-time column selection. The sense amplifier groups A, B, . . . , N-1 share data buses D_BUS in response to column selection signals Yi_Top<0>–Yi_Top<k-1>, YI_Bot<0>–YiBot_<k-1>.

The data buses D_BUS are arranged symmetrically between the sense amplifiers SAs and two cell array groups TOP_CA, BOT_CA, and are selectively connected to the sense amplifier groups A, B, . . . , N-1 in response to the column selection signals Yi_Top<0>–Yi_Top<k-1>, YI_Bot<0>–YiBot_<k-1> and transfer differential data.

Figure 8:
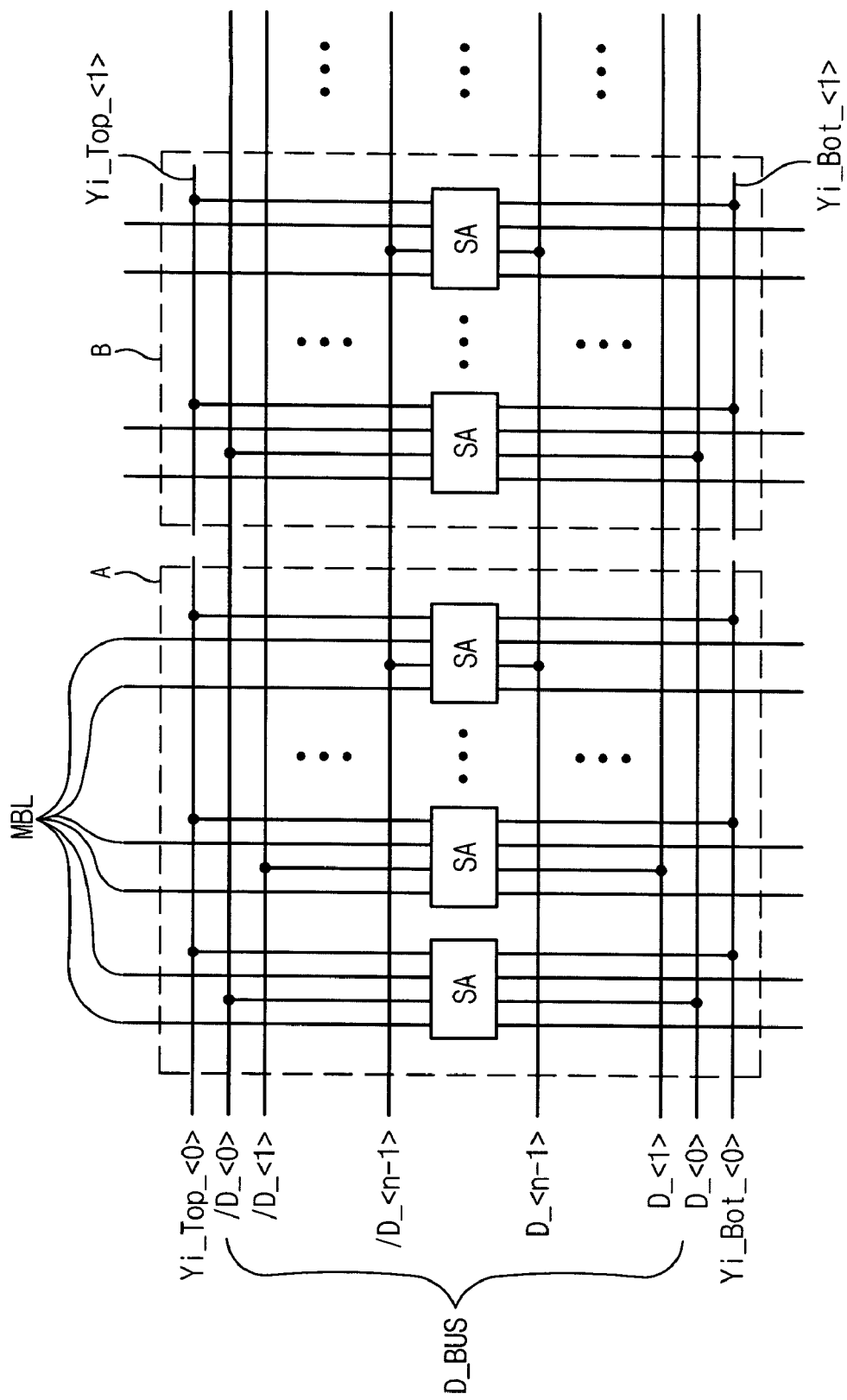
FIG. 8 and FIG. 9 are schematic diagrams illustrating in detail the architecture of FIG. 7.
Figure 9:
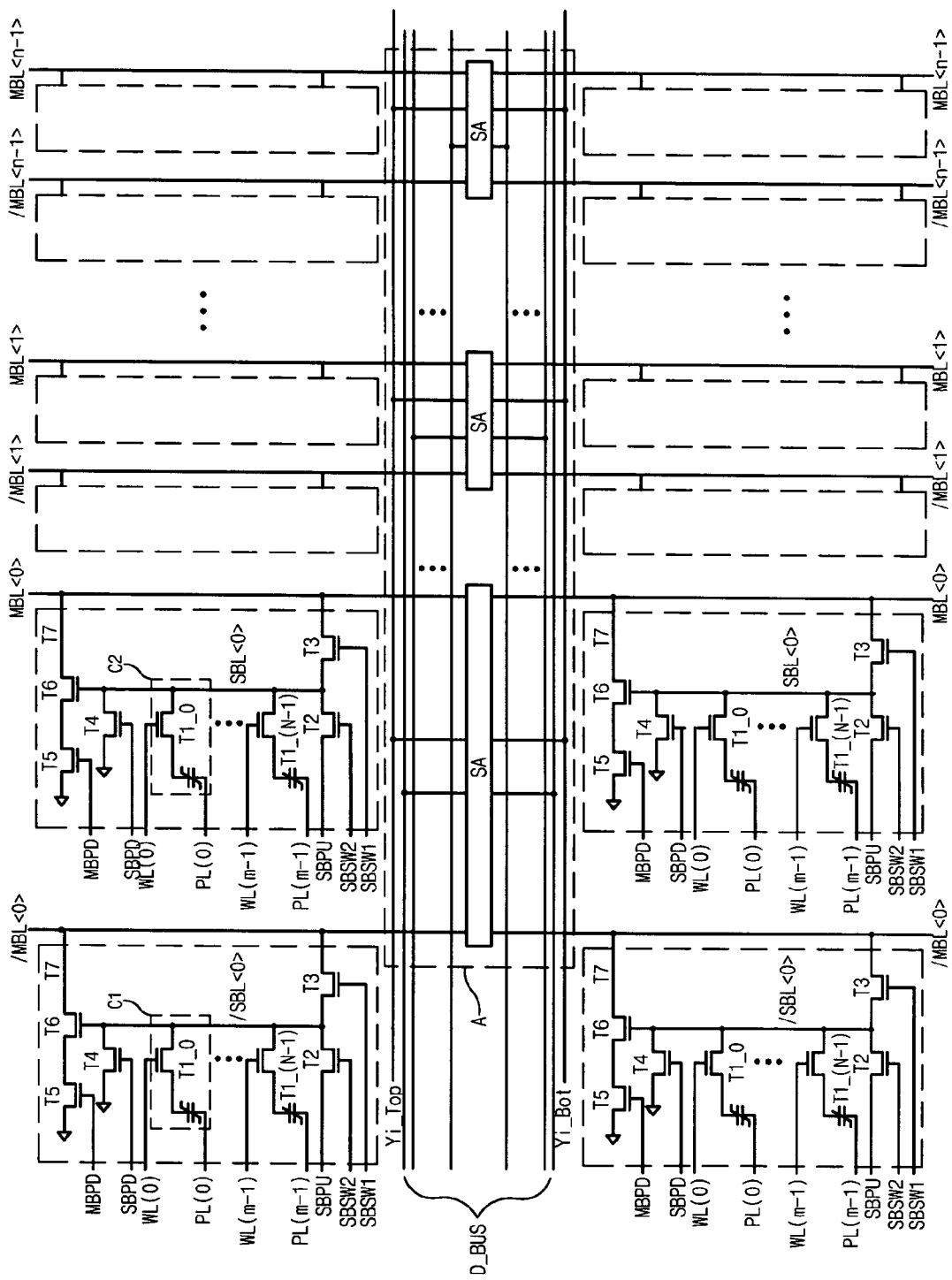

FIG. 8 and FIG. 9 are schematic diagrams illustrating in detail the architecture of FIG. 7.

The data buses D_BUS are divided into top buses /D_<0>–/D_<n-1> and bottom buses D_<0>–D_<n-1>. The top buses /D_<0>–/D_<n-1> are selectively connected to one of the sense amplifier groups A, B, . . . , N-1 in response to the column selection signals Yi_Top<0>–Yi_Top<k-1>. Likewise, the bottom buses D_<0>–D_<n-1> are selectively connected to one of the sense amplifier groups A, B, . . . , N-1 in response to the column selection signals Yi_Bot<0>–YiBot_<k-1>.

In the cell array in FIG. 4, the sensing voltages induced on the main bit lines in response to the column selection signals CS0, CS1 were transferred to the sense amplifier S/A through the common data bus BUS(0). In the cell array in FIG. 9, however, the main bit lines MBL are directly connected to the sense amplifier SA.

Figure 10:
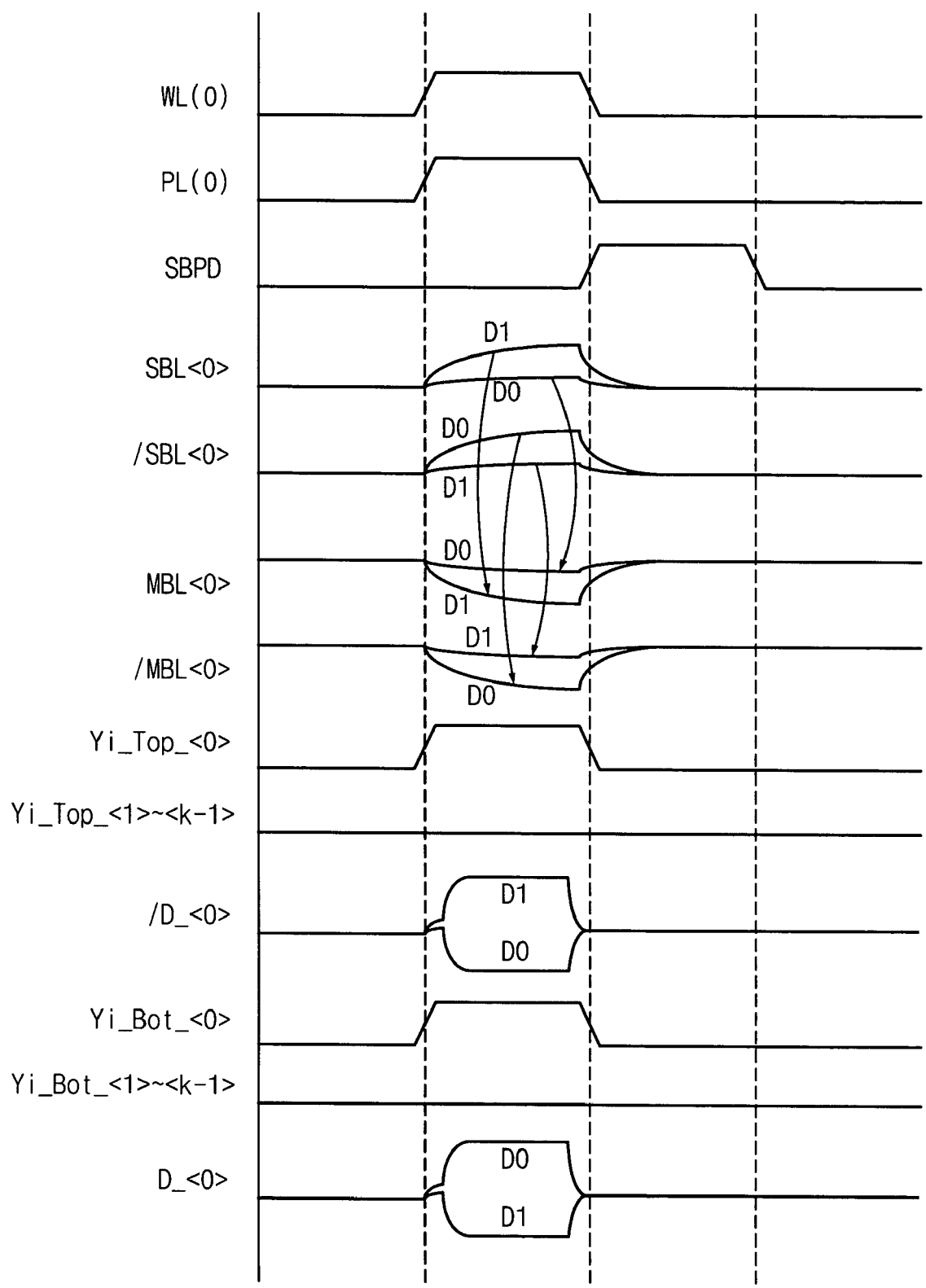
FIG. 10 is a timing diagram for explaining the operation of a non-volatile ferroelectric memory device according to a first embodiment of the present invention.

FIG. 10 is a timing diagram for explaining the operation of a non-volatile ferroelectric memory device according to a first embodiment of the present invention.

When a word line WL(0) and a plate line PL(0) are activated, voltages of different levels are induced on sub bit lines SBL<0>, /SBL<0> by differential data stored in two unit cells C1, C2 corresponding to the differential main bit lines /MBL<0>, MBL<0> in the top cell array group TOP_CA (or in the bottom cell array group BOT_CA). By the induced voltages on the sub bit lines SBL<0>, /SBL<0>, voltages of different levels are also induced on differential main bit lines MBL<0>, /MBL<0>.

The induced two voltages on the differential main bit lines MBL<0>, /MBL<0> are applied to the sense amplifier SA, and the sense amplifier SA compares the two voltages to sense differential data.

The sensed differential data are respectively applied to data buses /D_<0> and D_<0> in response to the column selection signals Yi_Top_<0> and Yi_Bot_<0>, and are transferred to the data buffer unit 20.

When the data sensing operation is completed, a sub bit line pull-down signal SBPD is activated and a transistor T4 is turned on so that the voltages on the sub bit lines SBL<0>, /SBL<0> are lowered to the ground level.

In short, by sensing a data based on differential data and by applying sensing voltages on the differential main bit lines MBL, /MBL directly to the sense amplifiers SA, sensing speed of the memory device can be improved and the memory device can sense a stable data value.

Figure 11:
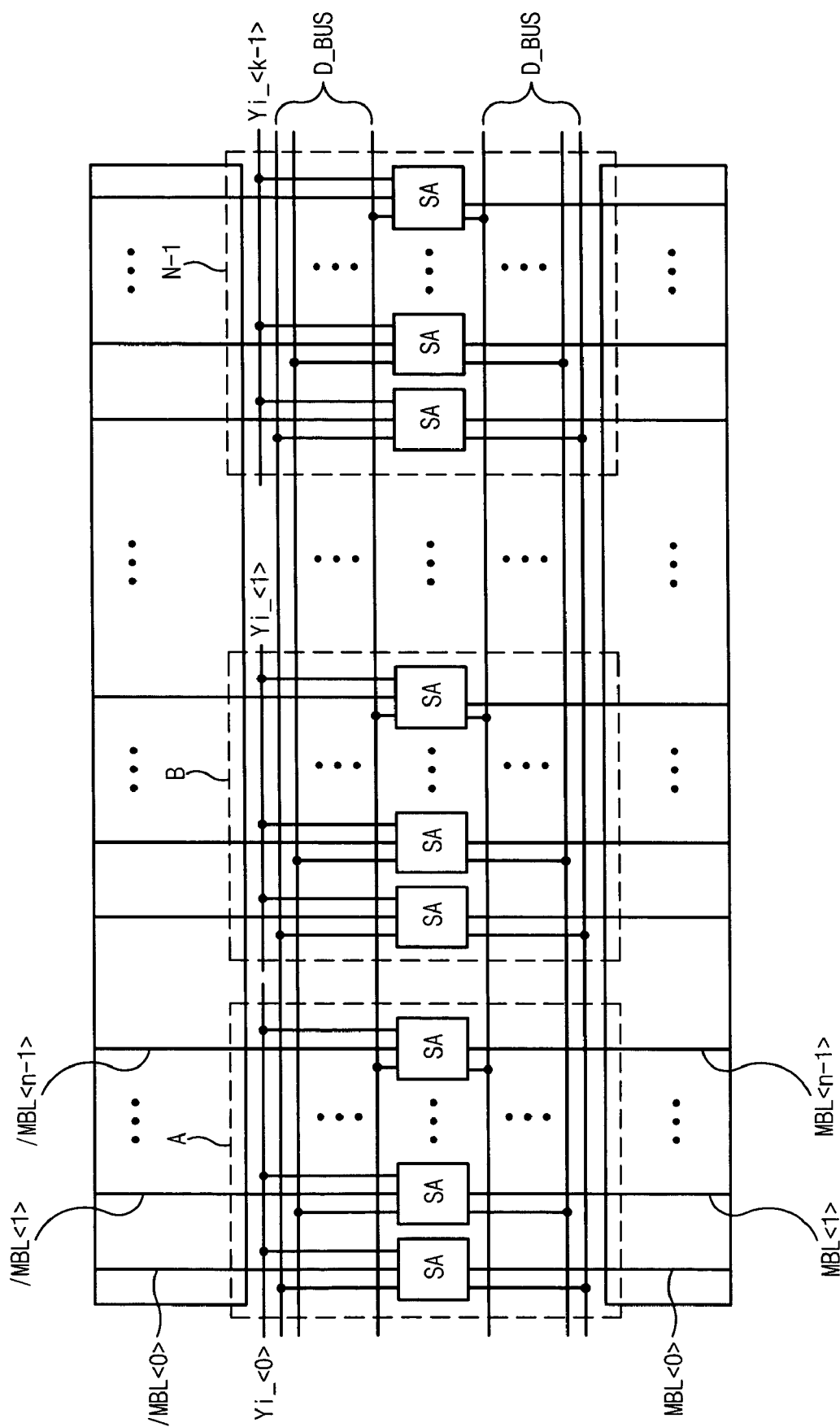
FIG. 11 is a schematic diagram of a cell array block of FIG. 6, illustrating a connection relation between main amplifier lines and a sense amplifier according to a second embodiment of the present invention.

FIG. 11 is a schematic diagram of the cell array block 10 of FIG. 6, illustrating a connection relation between main amplifier lines MBL, /MBL and a sense amplifier according to a second embodiment of the present invention.

In the embodiment of FIG. 11, differential data are stored in the top cell array group TOP_CA and the bottom cell array group BOT_CA. That is, a data /D is stored in the top cell array group TOP_CA, and a data D is stored in the bottom cell array group BOT_CA.

Therefore, differential main bit lines MBL, /MBL consist of a main bit line in the top cell array group TOP_CA and a main bit line in the bottom cell array group BOT_CA. Here, the top and bottom cell array groups are arranged symmetrically around the sense amplifiers SAs.

In other words, the respective sense amplifier SA is connected to the differential main bit lines MBL, /MBL, namely one main bit line /MBL in the top cell array group TOP_CA and one main bit line MBL in the bottom cell array group BOT_CA, and senses differential data. And, sense amplifier groups A, B, . . . , N-1 share data buses D_BUS in response to column selection signals Yi_<0>–Yi_<k-1>.

The data buses D_BUS are arranged symmetrically between the sense amplifiers SAs and two cell array groups TOP_CA, BOT_CA, and are selectively connected to the sense amplifier groups A, B, . . . , N-1 in response to the column selection signals Yi_<0>–Yi_<k-1>, thereby transferring differential data.

Figure 12:
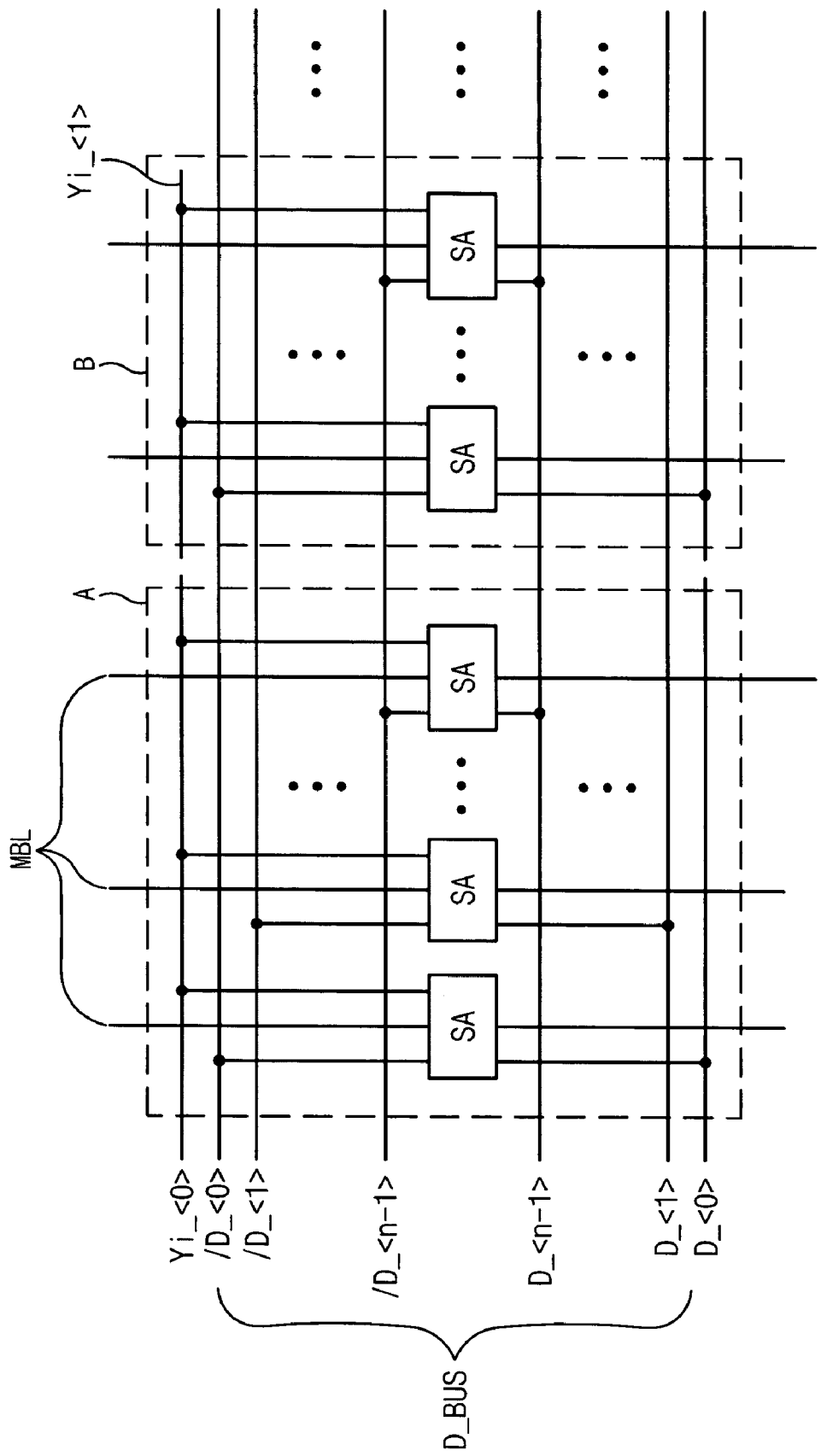
FIG. 12 and FIG. 13 are schematic diagrams illustrating in detail the architecture of FIG. 11.
Figure 13:
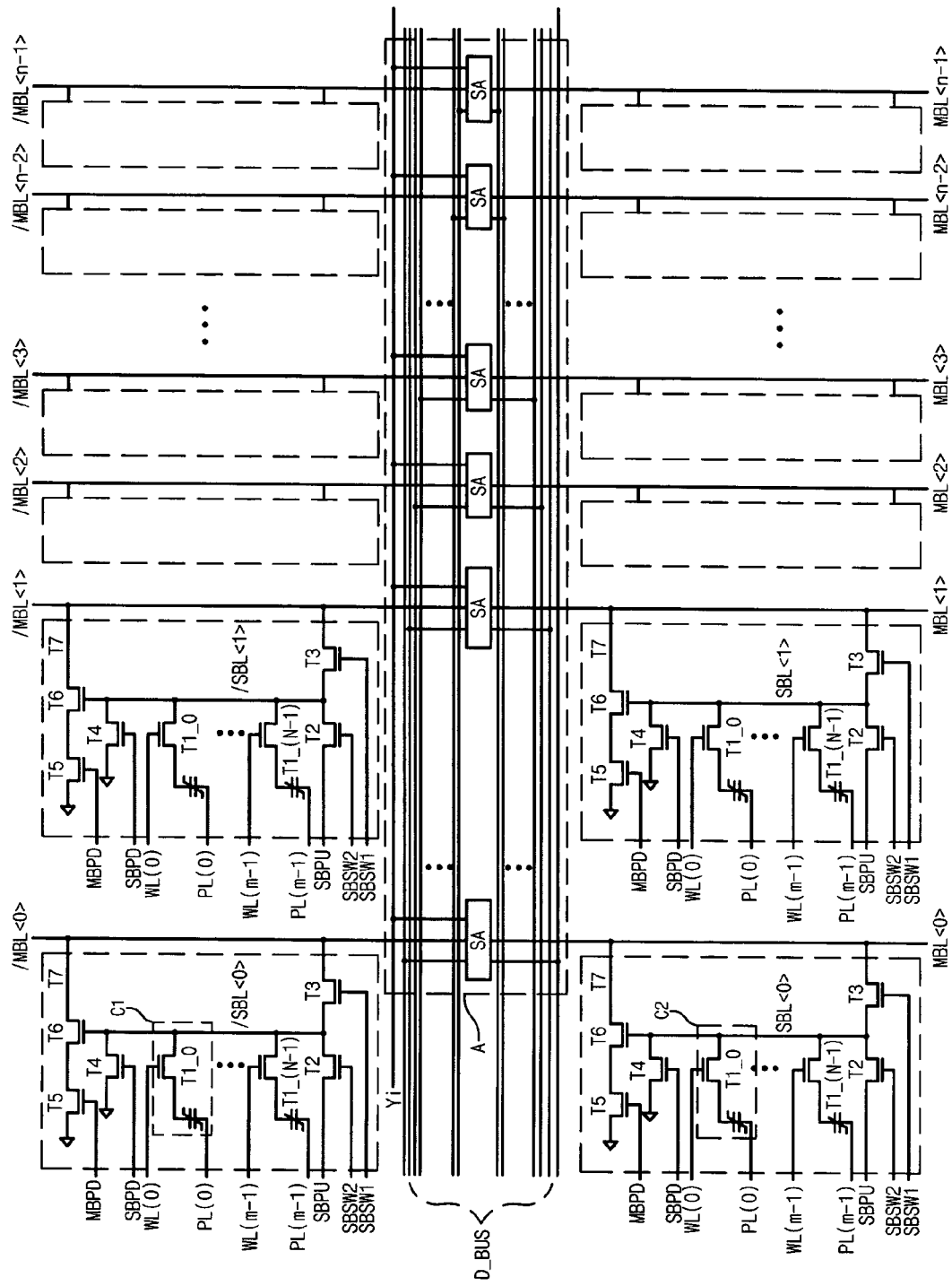

FIG. 12 and FIG. 13 are schematic diagrams illustrating in detail the architecture of FIG. 11.

The data buses D_BUS are divided into top buses /D_<0>–/D_<n-1> and bottom buses D_<0>–D_<n-1>. The top buses /D_<0>–/D_<n-1> and the bottom buses D_<0>–D_<n-1> are selectively connected to sense amplifier groups A, B, . . . , N-1 in response to the column selection signals Yi_<0>–Yi_<k-1>.

Figure 14:
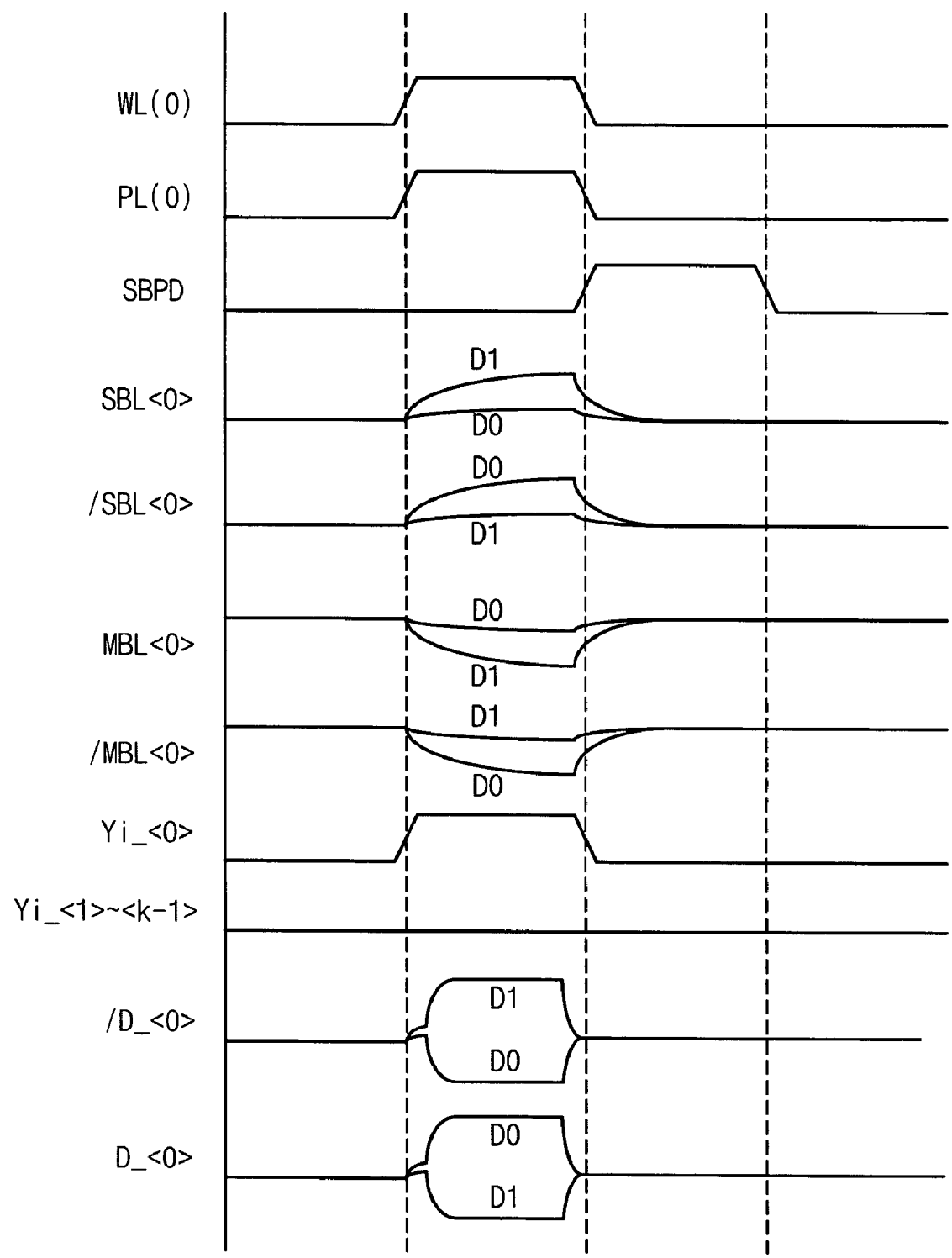
FIG. 14 is a timing diagram for explaining the operation of a non-volatile ferroelectric memory device according to a second embodiment of the present invention

FIG. 14 is a timing diagram for explaining the operation of a non-volatile ferroelectric memory device according to a first embodiment of the present invention.

When a word line WL(0) and a plate line PL(0) are activated, voltages of different levels are induced on sub bit lines SBL<0>, /SBL<0> by differential data stored in a unit cell C1 of the top cell array group TOP_CA and in a unit cell C2 of the bottom cell array group BOT_CA.

By the induced voltages on the sub bit lines SBL<0>, /SBL<0>, voltages of different levels are also induced on differential main bit lines MBL<0>, /MBL<0>.

The induced voltages on the differential main bit lines MBL<0>, /MBL<0> are applied to the sense amplifier SA, and the sense amplifier SA compares two voltages and senses differential data.

The sensed differential data are respectively applied to data buses /D_<0> and D_<0> in response to the column selection signal Yi_<0>, and are transferred to the data buffer unit 20.

When the data sensing operation is completed, a sub bit line pull-down signal SBPD is activated and a transistor T4 is turned on so that the voltages on the sub bit lines SBL<0>, /SBL<0> are lowered to the ground level.

Figure 15:
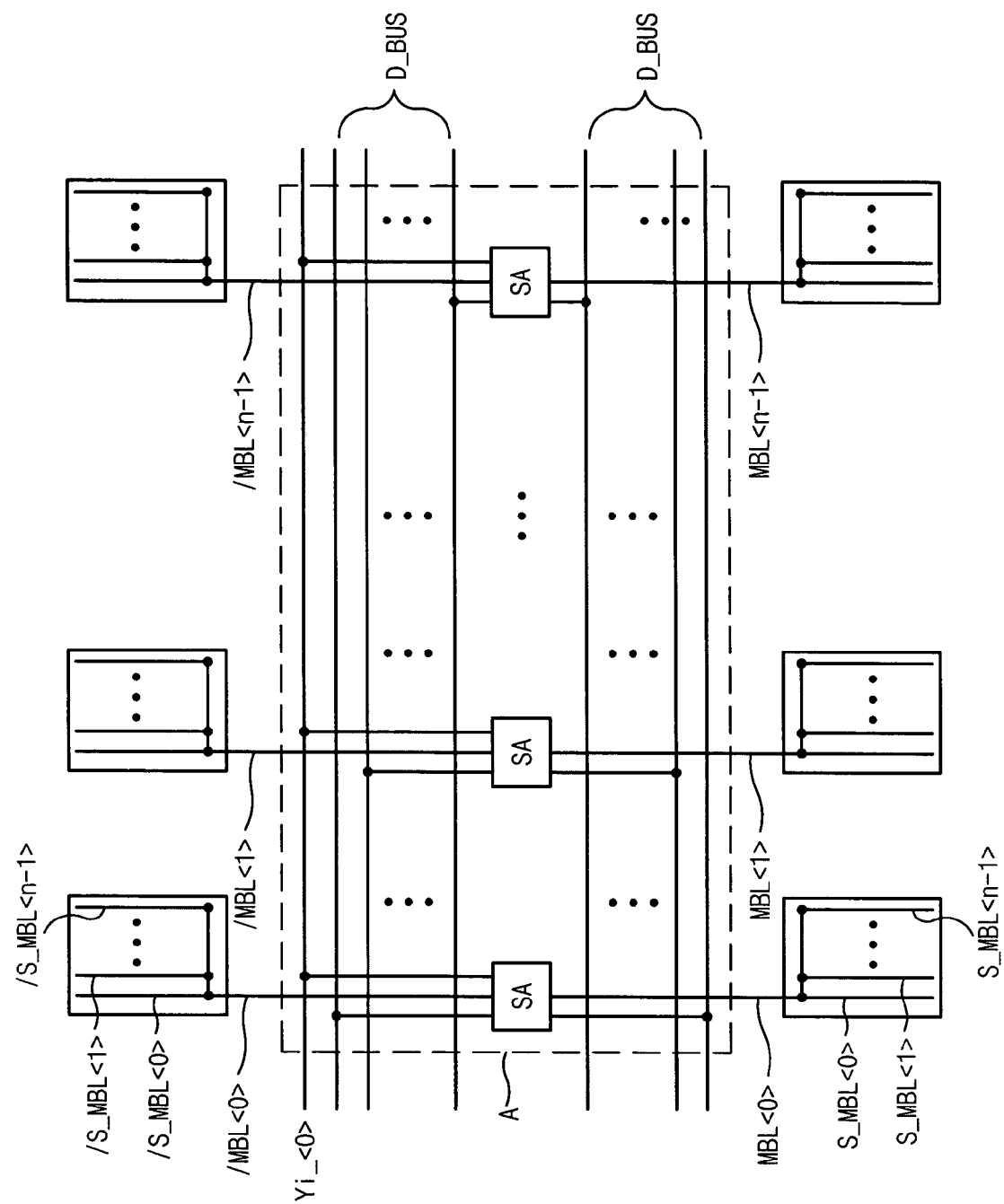
FIG. 15 is a schematic diagram illustrating a connection relation between main amplifier lines and a sense amplifier according to a third embodiment of the present invention.

FIG. 15 is a schematic diagram illustrating a connection relation between main amplifier lines MBL, /MBL and a sense amplifier according to a third embodiment of the present invention.

Referring to FIG. 15, each end of a plurality of adjacent main bit lines /S_MBL<0>–/S_MBL<n-1>, S_MBL<0>–S_MBL<n-1> in the upper and lower cell array groups TOP_CA and BOT_CA is commonly connected to each other, thereby forming one group, and the respective main bit line groups are coupled to one sense amplifier SA. That is to say, a 1-bit data is stored not in one unit cell but in a plurality of unit cells located at the same positions in the main bit line groups /S_MBL<0>–/S_MBL<n-1>, S_MBL<0>–S__MBL<n-1>.

To this end, the ends of a plurality of adjacent main bit lines /S_MBL<0>–/S_MBL<n–1>, S_MBL<0>–S_MBL<n–1> are commonly connected as shown in FIG. 15. As a result, during a data write operation, the same data is written in the cell arrays at the same positions in main bit lines /S_MBL<0>–/S_MBL<n–1>, S_MBL<0>–S_MBL<n–1> which are commonly connected. And, during a data read operation, an average voltage of sensing voltages induced on the plural main bit lines /S_MBL<0>–/S_MBL<n–1>, S_MBL<0>–S_MBL<n–1> which are commonly connected is applied to each sense amplifier SA.

Accordingly, because the voltage that is actually sensed by the sense amplifier SA is the average with voltages of other normal cells even if a non-volatile ferroelectric capacitor in a certain unit cell is in abnormal (WEAK) state, the memory device is now capable of sensing a stable, good data value.

Other structure and functions are identical with those in the second embodiment.

Figure 16:
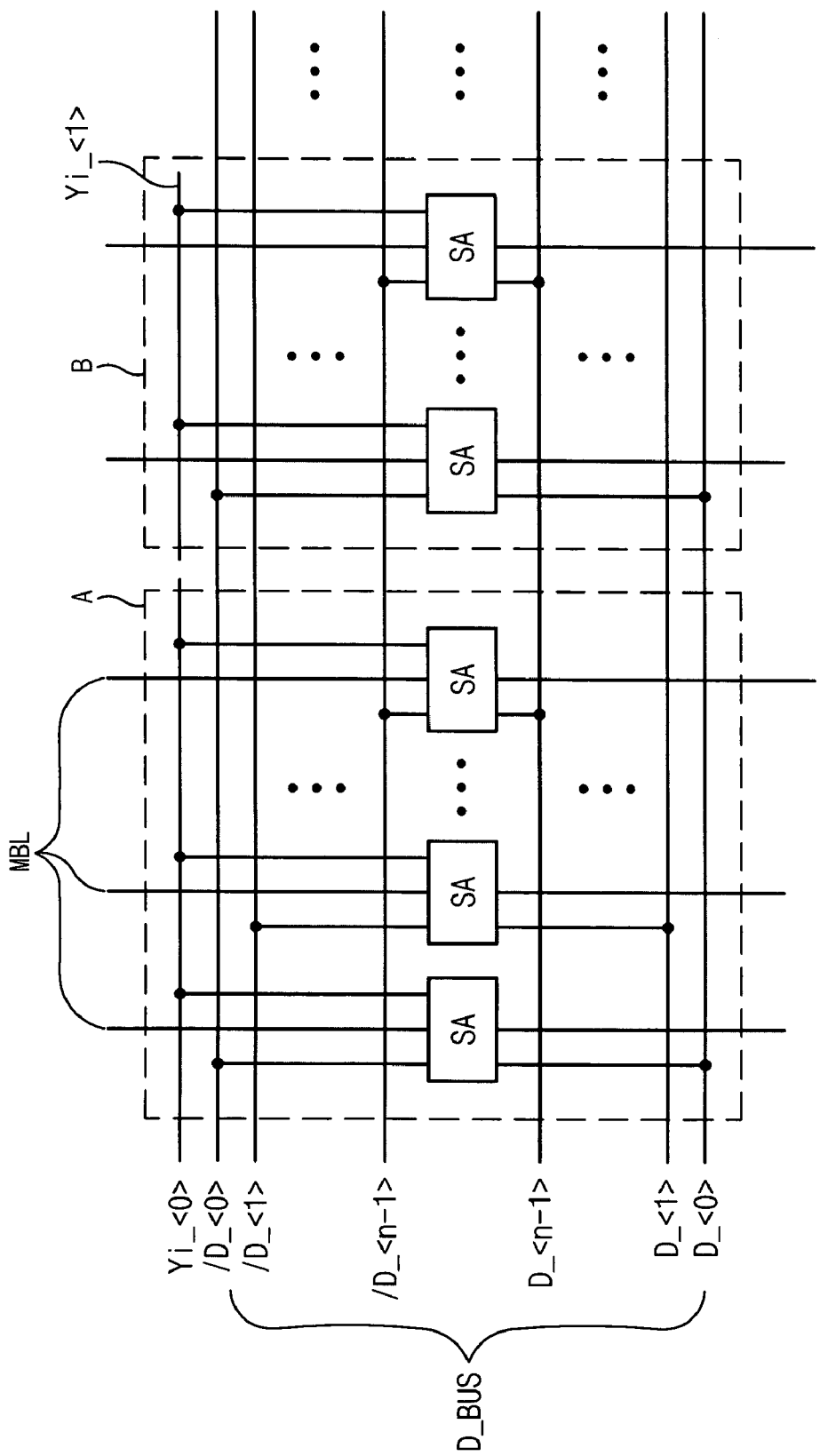
FIG. 16 and FIG. 17 are schematic diagrams illustrating in detail the architecture of FIG. 15.
Figure 17:
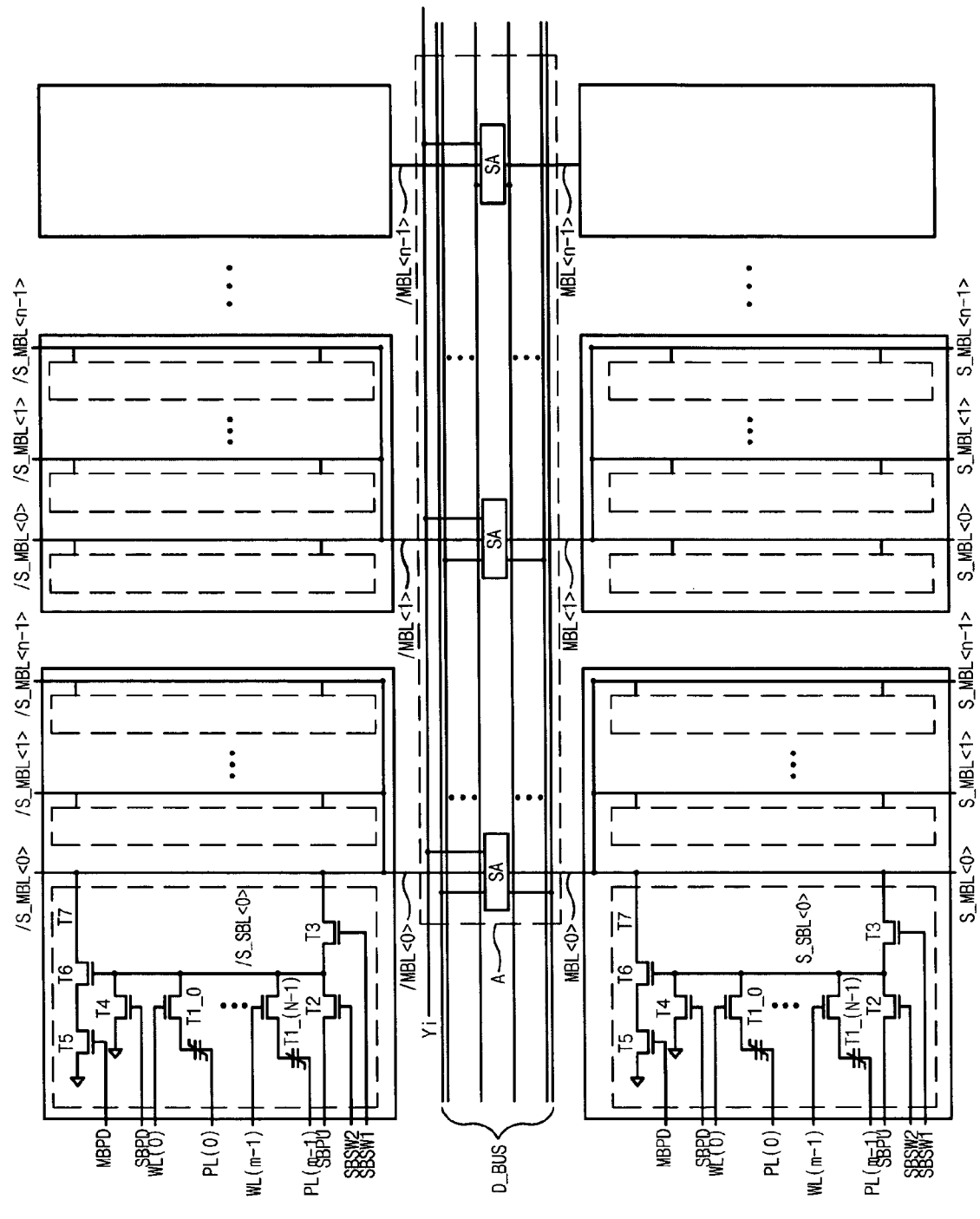

FIG. 16 and FIG. 17 are schematic diagrams illustrating in detail the architecture of FIG. 15.

The circuit structure of FIG. 16 is same as that of FIG. 12, and the circuit structure in FIG. 17 is also almost identical with the circuit structure in FIG. 13 except that a plurality of main bit lines is commonly connected to be in correspondence to one sense amplifier SA.

The third embodiment suggests that a plurality of the main bit lines /S_MBL<0>–/S_MBL<n–1>, S_MBL<0>–S_MBL<n–1> being commonly connected to each other should be positioned in the top and bottom cell array groups TOP_CA and BOT_CA, respectively. However, it is also possible to locate the main bit lines in the same cell array group, as they are in the first embodiment.

In conclusion, a non-volatile ferroelectric memory device having differential data according to an embodiment of the present invention is capable of sensing a stable, good data value because differential data are stored and sensed in a cell array with a hierarchical bit line architecture using at least two main bit lines. Moreover, in the non-volatile ferroelectric memory device having differential data, main bit lines are divided into two groups around a sense amplifier position at the center of the main bit lines. In this way, the sense amplifiers are directly connected to the main bit lines and thus, sensing speed can be improved.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A non-volatile ferroelectric memory device comprising:
a plurality of cell array blocks each comprising
a plurality of cell arrays each having a hierarchical bit line architecture including a plurality of sub bit lines selectively coupled to one of a plurality of differential main bit lines, wherein the plurality of cell arrays each includes a plurality of unit cells, the plurality of cell arrays are divided into a top cell array group and a bottom cell array group, the plurality of unit cells each stores a differential data;
a plurality of sense amplifiers each, positioned between the divided cell array groups, for receiving voltages induced on the differential main bit lines to sense and amplify a differential data; and
a data buffer unit for temporarily storing the differential data amplified by the sense amplifier and the differential data received through a data I/O port.

2. The device according to claim 1, wherein the plurality of cell array blocks comprise:
the top cell array group and the bottom cell array group comprising the cell arrays and divided by the sense amplifiers located at the center;
the sense amplifiers, located between the top cell array group and the bottom cell array group and connected to the differential main bit lines of the top and bottom cell array groups, for sensing the differential data and outputting the amplified differential data in response to a column selection signal; and
data buses, located between the sense amplifiers and the respective cell array group, for transferring the differential data amplified by the sense amplifiers to the data buffer unit.

3. The device according to claim 1, wherein each of the differential main bit lines comprises two adjacent main bit lines in the top cell array group and the bottom cell array group.

4. The device according to claim 1, wherein each of the differential main bit lines comprises two main bit line groups, each of the main bit line groups includes a plurality of main bit lines being commonly connected to each other.

5. The device according to claim 1, wherein each of the differential main bit lines comprises two main bit lines in the top and bottom cell array groups, the two main bit lines are arranged symmetrically around the sense amplifiers.

6. The device according to claim 5, wherein each of the differential main bit lines comprises two main bit line groups, each of the main bit line groups includes a plurality of main bit lines being commonly connected to each other.

* * * * *